Aug. 19, 1969 KOICHI IKEDA ET AL 3,462,298

OXIDE COATING FOR SEMICONDUCTOR SURFACES

Filed Sept. 8, 1965

INVENTORS
KOICHI IKEDA
KATSUJI MINAGAWA
TORU NAKAGAWA
BY
Hopgood & Calimafde
ATTORNEYS.

3,462,298

OXIDE COATING FOR SEMICONDUCTOR SURFACES

Koichi Ikeda, Katsuji Minagawa, and Toru Nakagawa, Tokyo, Japan, assignors to Nippon Electric Company Limited, Minatoku, Tokyo, Japan, a corporation of Japan Filed Sept. 8, 1965, Ser. No. 485,895
Claims priority, application Japan, Sept. 9, 1964, 39/51,542
Int. Cl. H01b *1/08;* C23c *13/02*
U.S. Cl. 117—201 1 Claim

ABSTRACT OF THE DISCLOSURE

Contamination of the surfaces of semiconductor devices such as diodes, rectifiers, and transistors, is obviated by vapor depositing particularly over the junction area, a substance including a major percentage of lead oxide and a minor percentage of at least one metal oxide selected from among tungsten oxide, molybdenum oxide, chromium oxide, and germanium oxide.

The present invention relates to semiconductor devices, and in particular to stabilizing the surfaces of such devices.

The surface state of semiconductor devices, such as diodes, rectifiers and transistors, is one of the most important factors affecting its dynamic characteristics and reliability. Water particles appearing on the device's surface are especially detrimental since they provide extra current paths and result in unstable characteristics. It is necessary, therefore, to eliminate water vapor and other possible sources of contamination (such as vapor absorbing materials and substances which ionize in water) from the surface of the device prior to its encapsulation and to seal the device in a contamination free container.

When the semiconductor device is molded directly in resin, surface instability occurs by virtue of atmospheric vapor diffusing through the resin or leaking through any path between the resin and lead wires due to the difference in the coefficients of thermal expansion. Accordingly, the reliability of conventionally molded resin products is rather poor and they cannot be used in places where high reliability is required.

Accordingly, it is the object of this invention to stabilize the surface characteristics of semiconductor devices.

It is a further object of this invention to accomplish the foregoing object in such a manner that inexpensive resin encapsulation may be utilized with high reliability.

Briefly, the invention is predicated upon the concept of depositing a thin peripheral layer of lead oxide containing a minor percentage of tungsten oxide, molybdenum oxide, chrominum oxide and/or germanium oxide, particularly at the junction. By depositing such a substance on the semiconductor device while it has a clean surface without the presence of water vapor or any other contamination, the characteristics of the device do not deteriorate even if the device is molded in a resin and the reliability is substantially improved.

Figure 1:
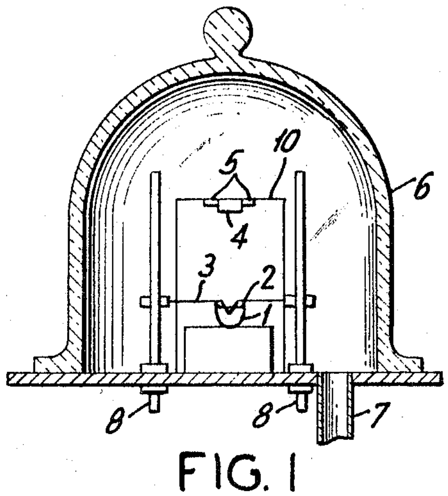
Figure 2:
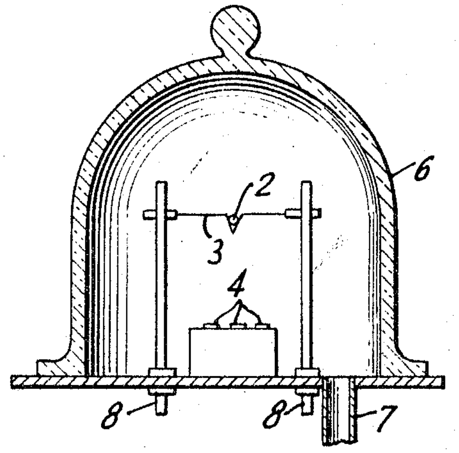
Figure 3:
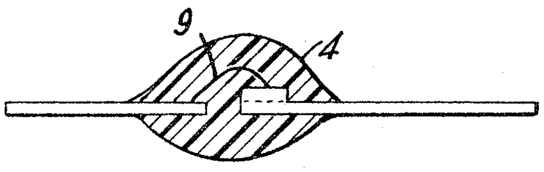

The above mentioned and other features and objects of this invention and the manner of attaining them will become more apparent and the invention itself will best be understood by reference to the following description of embodiments of the invention taken in conjunction with the accompanying drawings wherein:

FIGS. 1 and 2 illustrate alternative methods for introducing the peripheral coating according to the invention; and FIG. 3 shows, in cross-section, a germanium diode incorporating the invention.

Turning now o FIG. 1, there may be seen a crucible which has a tungsten heater 3 disposed therein so that it may be covered with red lead ($Pb_3O_4$) 2. The germanium diode 4 is placed above the opening of the crucible 1, as shown in the drawing, and if the lead wires are of iron, nickel alloy or another parametric material, a magnet 5 may be utilized to hold the element in position. A bell jar 6 is placed over the foregoing elements and exacuated to a pressure of approximately $10_{-5}$ mm. of Hg through an exhaust 7. Sufficient voltage is then applied across terminals 8–8' to raise the temperature of the heater to 1000° C. Consequently, the mixture of lead oxide and tungsten oxide will be vapor deposited on the diode element 4. A film of .2 to .5 micron thick has been found sufficient; the diode element then being molded in epoxy resin 9 as shown in FIG. 3.

When a diode prepared in the foregoing manner was exposed to a temperature of 65° C. and 95% relative humidity for 1000 hours, no deterioration was detected in its characteristics. Untreated control diodes, on the other hand, similarly exposed for 125 hours, were found to deteriorate.

An alternative method is shown in FIG. 2. In this case 95 grams of PbO and 5 grams of $WO_3$ were mixed and melted in a crucible of alumina. The resultant substance was put on a platinum heater 3 and evaporated similarly to the foregoing embodiment, onto a clean surfaced germanium diode element 4. As before, the diode element was molded in epoxy resin and the characteristics measured. Again, no deterioration was observed after a 1000 hour test at 95% relative humidity.

Results similar to the foregoing were obtained with silicon semiconductor elements, as well as the mentioned germanium type, variously coated with a mixture of 95% PbO, as in the first embodiment, and 5% of one of the following: $WO_3$, $MoO_3$, $Cr_2O_3$ or $GeO_2$. Similar results were also obtained with a coating including 94% PbO and 3% $WO_3$ and 3% $MoO_3$ or 3% $MoO_3$ and 3% $Cr_2O_3$. The coating composition: PbO—88%, $MoO_3$—5%, $Cr_2O_3$—5% and $WO_3$—2%, also gave similar favorable results.

In the first of the shown and described embodiments the deposited film results from the straight evaporation of the melted mixture. In the second embodiment, however, it will be apparent to those skilled in the art that when red lead is evaporated in a tungsten or molybdenum heater, the resultant oxides of tungsten and molybdenum are mixed with that of lead and come into existence through the following reaction:

$$Pb_3O+W(Mo)\rightarrow 3PbO+WO_3(MoO_3)$$

While we have described above the principles of our invention in connection with specific apparatus, it is to be clearly understood that this description is made only by way of example and not as a limitation to the scope of our invention as set forth in the objects thereof. For example, the apparent restriction of mixing one or more of tungsten oxide, molybdenum oxide, chormium oxide and germanium oxide with lead oxide in the ratio of 12% or less, is a practical limitation which arises from the inherent difficulty encountered when evaporating the mixture where it is less than 88% lead oxide.

What is claimed is:

1. A semiconductor device comprising a peripheral film formed by vapor deposition and embracing the junction area of said device, of a substance consisting essentially of a major percentage of PbO and at least one metal oxide, in the percentage of 5 to 12%, selected from the group consisting of tungsten oxide, molybdenum oxide, chromium oxide, and germanium oxide.

References Cited

UNITED STATES PATENTS

| | | | |
|---|---|---|---|
| 2,937,110 | 5/1960 | John | 117—218 |
| 2,989,424 | 6/1961 | Angello | 117—200 |
| 3,222,219 | 12/1965 | Saunders et al. | 117—218 |
| 3,303,399 | 2/1967 | Hoodgendorn et al. | 117—200 X |

WILLIAM D. MARTIN, Primary Examiner

R. HUSACK, Assistant Examiner

U.S. Cl. X.R.

117—106, 169, 218; 317—234